US012049547B2

(12) United States Patent
Strzegowski et al.

(10) Patent No.: US 12,049,547 B2
(45) Date of Patent: Jul. 30, 2024

(54) HOT MELT COMPOSITION IN THE FORM OF A FILM FOR USE IN THIN FILM PHOTOVOLTAIC MODULES

(71) Applicant: H.B. Fuller Company, St. Paul, MN (US)

(72) Inventors: Luke A. Strzegowski, West Whately, MA (US); Jayesh G. Bokria, South Windsor, CT (US); Thomas F. Kauffman, Bloomfield, CT (US)

(73) Assignee: H.B. Fuller Company, St. Paul, MN (US)

( * ) Notice: Subject to any disclaimer, the term of this patent is extended or adjusted under 35 U.S.C. 154(b) by 0 days.

(21) Appl. No.: 18/310,233

(22) Filed: May 1, 2023

(65) Prior Publication Data

US 2023/0272174 A1    Aug. 31, 2023

Related U.S. Application Data

(63) Continuation of application No. 17/659,422, filed on Apr. 15, 2022, now Pat. No. 11,674,008.

(60) Provisional application No. 63/201,167, filed on Apr. 15, 2021.

(51) Int. Cl.
| | |
|---|---|
| *H01L 31/046* | (2014.01) |
| *C08J 5/18* | (2006.01) |
| *C08L 33/08* | (2006.01) |
| *H01L 31/048* | (2014.01) |

(52) U.S. Cl.
CPC ............... *C08J 5/18* (2013.01); *C08L 33/08* (2013.01); *H01L 31/046* (2014.12); *H01L 31/0481* (2013.01); *H01L 31/0488* (2013.01); *C08J 2333/08* (2013.01)

(58) Field of Classification Search
CPC ......... C08L 33/08; C08J 2333/08; C08J 5/18; H01L 31/046; H01L 31/0481; H01L 31/0488
See application file for complete search history.

(56) References Cited

U.S. PATENT DOCUMENTS

2010/0295091 A1*  11/2010  Strzegowski ....... C08L 23/0869
                                                257/E33.059
2017/0125620 A1*   5/2017  Jacques ............... C08L 23/0884

* cited by examiner

*Primary Examiner* — Mayla Gonzalez Ramos
(74) *Attorney, Agent, or Firm* — Kristi Halloran; Kirsten Stone

(57) ABSTRACT

The invention features a hot melt composition in the form of a film including from 40% by weight to 80% by weight of a non-functionalized alkyl acrylate, from 14% by weight to 50% by weight of an olefin polymer, from 2% by weight to 15% by weight of a first functionalized polymer comprising a functional group selected from the group consisting of epoxides and carboxylic anhydrides, and from 2% by weight to 15% by weight of a second functionalized polymer comprising a functional group capable of reacting with the functional group of the first functionalized polymer.
The hot melt composition in the form of a film has found utility as an encapsulant for thin film photovoltaic modules.

20 Claims, 1 Drawing Sheet

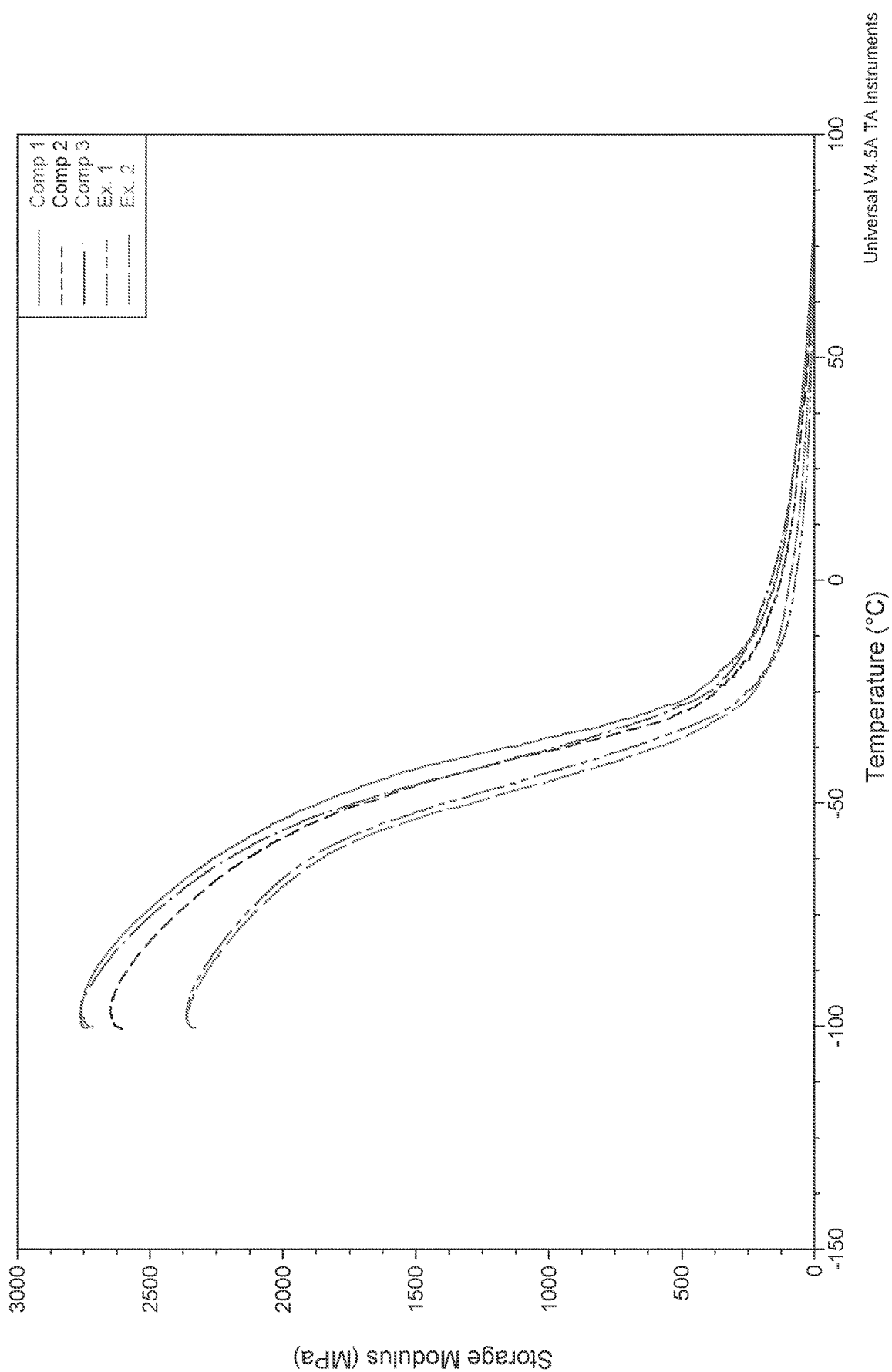

HOT MELT COMPOSITION IN THE FORM OF A FILM FOR USE IN THIN FILM PHOTOVOLTAIC MODULES

This application is a Continuation of U.S. patent application Ser. No. 17/659,422, filed Apr. 15, 2022 which claims the benefit of U.S. Provisional Patent Application No. 63/201,167 filed on Apr. 15, 2021 which is incorporated herein.

BACKGROUND

A crystalline silicon photovoltaic (PV) module commonly includes a photovoltaic layer, usually mono or multi-crystalline silicon, laminated between two encapsulant layers, with a thick glass substrate as the front layer and a protective back sheet. Additional layers can be found between these layers e.g. tie layers and adhesives. The crystalline PV module is rigid. The crystalline PV module can often have a breathable construct i.e. there is no seal holding it together at the edges. As such, low cost encapsulants e.g. peroxide cured alkyl acetates can be used since left over peroxide material can diffuse through the edges into the atmosphere and thus not harm the module.

A thin film PV module includes photovoltaic cells that are thinner and less expensive. A thin film PV module commonly includes a front sheet on which the photovoltaic cells can be deposited, an encapsulant, and a back sheet. The photovoltaic cells within the thin film PV module can be around 350 times thinner than those in the crystalline PV module. This gives the thin film PV module the advantage of being lighter and more maneuverable as compared to the crystalline silicon PV module. However, since there is generally an edge seal present around the outer edge of a thin film PV module, materials such as peroxide, or polymers that break down to form acid e.g. ethylene vinyl acetate cannot be used in the encapsulant. This is because the materials that form would be trapped in the module and could damage it. Further, in the thin film PV module since there is often only one layer of encapsulant, there is an increased stress put on the encapsulant.

There is a need for encapsulants for thin film PV modules that are free of materials that can contaminate the module e.g. peroxides, acids, etc., provide a balance of heat resistance and adhesion, withstand environmental changes and are economical in cost.

SUMMARY

In one aspect, the invention features a hot melt composition in the form of a film including from 40% by weight to 80% by weight of a non-functionalized alkyl acrylate, from 14% by weight to 50% by weight of an olefin polymer, from 2% by weight to 15% by weight of a first functionalized polymer comprising a functional group selected from the group consisting of epoxides, carboxylic anhydrides and carboxylic acids, and from 2% by weight to 15% by weight of a second functionalized polymer comprising a functional group capable of reacting with the functional group of the first functionalized polymer.

In one embodiment, the hot melt composition has an Approximate Melt Index of from 5 g/10 min to 80 g/10 min. In another embodiment, the non-functionalized alkyl acrylate is selected from the group consisting of ethylene n-butyl acrylate and ethylene methyl acrylate. In a different embodiment, the non-functionalized alkyl acrylate is ethylene n-butyl acrylate. In one embodiment, the ethylene n-butyl acrylate has an n-butyl acrylate content of from 3% by weight to 35% by weight. In another embodiment, the ethylene n-butyl acrylate has a Melt Index of from 5 g/10 min to 50 g/10 min when tested by ASTM D 1238 (190° C., 2.16 kg). In one embodiment, the olefin polymer is a single-site catalyzed ethylene copolymer.

In another embodiment, the olefin polymer has a density as tested according to ASTM D 792 of no greater than 0.92 g/cm$^3$. In one embodiment, the first functionalized copolymer and the second functionalized copolymer are ethylene copolymers.

In a different embodiment, the first functionalized polymer is selected from the group consisting of a random copolymer of ethylene and maleic anhydride, a random copolymer of ethylene, alkyl(meth)acrylate and maleic anhydride and, the second functionalized polymer is selected from a group consisting of a random copolymer of ethylene and glycidyl methacrylate and a random terpolymer of ethylene, alkyl(meth)acrylate and glycidyl methacrylate.

In one embodiment, the hot melt composition is free of ethylene vinyl acetate, peroxide, and poly vinyl chloride. In another embodiment, the hot melt composition includes from 55% by weight to 75% by weight of a non-functionalized alkyl acrylate, from 15% by weight to 25% by weight of an olefin, from 3% by weight to 10% by weight of a first functionalized polymer comprising a functional group selected from the group consisting of epoxides and carboxylic anhydrides, and from 3% by weight to 10% by weight of a second functionalized polymer comprising a functional group capable of reacting with the functional group of the first functionalized polymer.

In one embodiment, the hot melt composition further includes a silane adhesion promoter. In another embodiment, the hot melt composition further includes from 5% by weight to 50% by weight of a filler.

In one embodiment, the invention includes a thin film photovoltaic module comprising the hot melt composition. In another embodiment, the invention includes a thin film photovoltaic module including a front sheet, a layer of photovoltaic cells in contact with the front sheet, the hot melt composition in the form of a film, and a back sheet, wherein the hot melt composition in the form of a film is located between the photovoltaic cells and the back sheet and adheres the front sheet to the back sheet.

In another embodiment, the photovoltaic cells are selected from the group consisting of CIGS (copper indium gallium diselenide), CdTe (cadmium telluride), amorphous thin-film silicon (a-Si, TF-Si), copper indium disilenide (CIS), and perovskite based systems.

In a different embodiment, the thin film photovoltaic module further comprises an edge seal. In another embodiment, the back sheet and the front sheet are glass and the photovoltaic cells are CdTe.

The hot melt films of this invention have been found to have an ideal balance of heat resistance and adhesion in that they can be used as an encapsulant in thin film PV modules resulting in a module that can withstand environmental changes while being economical in cost.

BRIEF DESCRIPTION OF THE DRAWING

FIG. 1 is a graphical representation of the storage modulus data in Table 1.

DETAILED DESCRIPTION

Hot Melt Composition

This invention is directed to a hot melt composition in the form of a film (sometimes referred to as a sheet) including non-functionalized ethylene/alkyl acrylate copolymer, an olefin polymer and a combination of functionalized polymers.

The hot melt composition in the form of a film can include from 40% by weight to 80% by weight of a non-functionalized alkyl acrylate, from 14% by weight to 50% by weight of an olefin polymer, from 3% by weight to 15% by weight of a first functionalized polymer comprising a functional group selected from the group consisting of epoxides, carboxylic anhydrides and carboxylic acids, and from 3% by weight to 15% by weight of a second functionalized polymer comprising a functional group capable of reacting with the functional group of the first functionalized polymer.

The hot melt composition in the form of a film can include from 40% by weight to 80% by weight of a non-functionalized alkyl acrylate, from 14% by weight to 50% by weight of an olefin polymer, from 2% by weight to 15% by weight of a first functionalized polymer comprising a functional group selected from the group consisting of epoxides, carboxylic anhydrides and carboxylic acids, and from 2% by weight to 15% by weight of a second functionalized polymer comprising a functional group capable of reacting with the functional group of the first functionalized polymer.

The hot melt composition can include a significant amount of a non-functionalized copolymer of ethylene and alkyl acrylate, a single-site catalyzed olefin polymer having a density as tested according to ASTM D 792 of no greater than 0.92 g/cm³, and a limited amount of two different functionalized polymers.

The hot melt composition can include from 40% by weight to 74% by weight of a non-functionalized alkyl acrylate, from 14% by weight to 50% by weight of a single-site catalyzed ethylene copolymer having a density as tested according to ASTM D 792 of from 0.85 g/cm³ to 0.92 g/cm³, from 2% by weight to 15% by weight of a first functionalized polymer comprising a functional group selected from the group consisting of epoxides, carboxylic anhydrides and carboxylic acids, and from 2% by weight to 15% by weight of a second functionalized polymer comprising a functional group capable of reacting with the functional group of the first functionalized polymer.

The hot melt composition can include from 40% by weight to 74% by weight of a non-functionalized alkyl acrylate, from 14% by weight to 50% by weight of a single-site catalyzed ethylene copolymer having a density as tested according to ASTM D 792 of from 0.85 g/cm³ to 0.92 g/cm³, from 3% by weight to 15% by weight of a first functionalized polymer that is a copolymer of ethylene and an epoxy group and from 3% by weight to 15% by weight of a second functionalized polymer that is a copolymer of ethylene and at least one monomer selected from the group consisting of a carboxylic anhydride, a carboxylic acid, and combinations thereof.

The non-functionalized alkyl acrylate, the olefin polymer, the first functionalized polymer and the second functionalized polymer can comprise at least 80% by weight, at least 90% by weight, at least 95% by weight, from 80% by weight to 100% by weight or even from 90% by weight to 100% by weight of the hot melt composition.

The hot melt composition can be free of peroxides, ethylene vinyl acetate and poly vinyl chloride (PVC).

The hot melt composition can have an Approximate Melt Index of from 0.5 to 50 g/10 minutes (min), 5 to 50 g/10 min, or even from 10 to 30 g/10 min.

The inventors have discovered that the hot melt composition needs to have a relatively low storage modulus at a temperature range of between 0° C. and −50° C., or even between −20° C. and −50° C. to improve performance in response to changes in the environment (e.g. freeze/thaw cycles, changes in humidity, etc.). Storage modulus is a mechanical measure of the stiffness of a solid material.

The hot melt composition can have a storage modulus at a temperature of −40° C. of no greater than 1,100 megapascals (MPa), no greater than 1,050 MPa, no greater than 1,000 MPa, no greater than 900 MPa, from 100 MPa to 1,100 MPa, from 200 MPa to 1,050 MPa, from 300 MPa to 1,100 MPa, or even from 400 MPa to 1,100 MPa.

Non-Functionalized Ethylene Alkyl Acrylate Copolymer

The hot melt composition includes a significant amount of a non-functionalized copolymer of ethylene and an alkyl acrylate. The majority of the hot melt composition can comprise a non-functionalized ethylene alkyl acrylate copolymer. The hot melt composition can include more than one non-functionalized ethylene alkyl acrylate copolymer.

The alkyl acrylate can be selected from the group consisting of unsaturated carboxylic acid esters such as methyl acrylate, ethyl acrylate, isopropyl acrylate, n-butyl acrylate, isooctyl acrylate, methyl methacrylate, 2-ethylhexyl acrylate and isobutyl acrylate.

Preferred non-functionalized ethylene alkyl acrylate copolymers can be selected from the group consisting of ethylene n-butyl acrylate, ethylene methacrylate and ethylene methyl methacrylate.

The non-functionalized ethylene alkyl acrylate copolymer can have an alkyl acrylate content of from 3% by weight to 40% by weight, from 3% by weight to 35% by weight, from 10% by weight to 35% by weight, or even from 15% by weight to 30% by weight.

The non-functionalized ethylene alkyl acrylate copolymer can have a melt index of from 5 g/10 min to 100 g/10 min, from 5 g/10 min to 75 g/10 min, from 5 g/10 min to 50 g/10 min, or even from 5 g/10 min to 40 g/10 min as tested according to ASTM D1238 (190° C., 2.16 kg).

The non-functionalized ethylene alkyl acryate copolymer will preferably be obtained according to a "tubular" polymerization process.

Useful non-functionalized ethylene alkyl acrylate copolymers include those sold under the EBAC and EMAC trade designations such as EBAC SB2811, an ethylene n-butyl acrylate copolymer having a melt index of 20 g/10 min as tested according to ASTM D1238 (190° C., 2.16 kg) and an n-butyl acrylate content of 20% by weight, and EMAC SP2220, an ethylene methacrylate copolymer having a melt index of 20 g/10 min as tested according to ASTM D1238 (190° C., 2.16 kg) and an methacrylate content of 20% by weight both available from Westlake Polymers LLC (Houston, Texas), EBANTIX E20020, an ethylene n-butyl acrylate copolymer having a melt index of 20 g/10 min as tested according to ASTM D1238 (190° C., 2.16 kg) and an n-butyl acrylate content of 20% by weight, available from Repsol Chemicals (Madrid, Spain) and LOTRYL 35BA40, an ethylene n-butyl acrylate copolymer, available from SK Functional Polymer (Courbevoie, France)

The hot melt composition includes from 40% by weight to 80% by weight, from 40% by weight to 74% by weight, from 50% by weight to 80% by weight, from 55% by weight to 80% by weight, from 55% by weigh to 74% by weight, from 60% by weight to 80% by weight, or even from 60% by weight to 74% by weight of the non-functionalized ethylene alkyl acrylate copolymer.

Olefin Copolymer

The olefin copolymer functions to lower the modulus (or stiffness) of the composition and improve performance in response to changes in the environment (e.g. freeze/thaw cycles, changes in humidity, etc.)

The olefin copolymer can be a copolymer of ethylene and an alpha-olefin. The alpha-olefin can have from 3 to 30 carbon atoms. The alpha olefin can be selected from the group consisting of propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene.

The olefin polymer can be polymerized by known polymerization techniques e.g. Ziegler-Natta or single-site (e.g. metallocene) catalysis. In a preferred embodiment, the olefin polymer is polymerized by a single-site (e.g. metallocene) catalyst.

The olefin polymer can be functionalized i.e. modified with a functional group such as e.g. maleic anhydride, however in a preferred embodiment it is non-functionalized.

The olefin polymer can have a Mw/Mn ratio of no greater than 5, no greater than 3, or even no greater than 2, in which Mw and Mn respectively denote the weight-average molar mass and the number-average molar mass.

The olefin polymer can have a density as tested according to ASTM D 792 of no greater than 0.92 g/cm$^3$, no greater than 0.91 g/cm$^3$, no greater than 0.89 g/cm$^3$, no greater than 0.88 g/cm$^3$, from 0.85 g/cm$^3$ to 0.92 g/cm$^3$, or even from 0.85 g/cm$^3$ to 0.90 g/cm$^3$.

The olefin polymer can have a melt index of from 5 g/10 min to 100 g/10 min, from 5 g/10 min to 75 g/10 min, from 5 g/10 min to 50 g/10 min, or even from 5 g/10 min to 40 g/10 min as tested according to ASTM D1238 (190° C., 2.16 kg).

Useful olefin polymers include the ENGAGE series of polymers, including ENGAGE 8411, an ethylene-octene copolymer having a density of 0.88 g/cm$^3$ and a melt index of 18 g/10 min as tested according to ASTM D1238 (190° C., 2.16 kg) and ENGAGE PV8658, an ethylene-octene copolymer have a density of 0.90 g/cm$^3$ and a melt index of 30 g/10 min as tested according to ASTM D1238 (190° C., 2.16 kg) both available from The Dow Chemical Company (Midland, MI) and the SOLUMER series of polymers, including SOLUMER 8613, an ethylene-octene copolymer having a density of 0.863 g/cm$^3$ and a melt index of 13 g/10 min as tested according to ASTM D1238 (190° C., 2.16 kg) available from SK Innovation Co., Ltd. (Seoul, Korea).

The hot melt composition can include from 14% by weight to 60% by weight, from 14% by weight to 55% by weight, from 14% by weight to 50% by weight, from 14% by weight to 45% by weight, from 14% by weight to 40% by weight, or even from 14% by weight to 30% by weight of the olefin polymer.

The hot melt composition can include from 16% by weight to 60% by weight, from 16% by weight to 55% by weight, from 16% by weight to 50% by weight, from 16% by weight to 45% by weight, from 16% by weight to 40% by weight, or even from 16% by weight to 30% by weight of the olefin polymer.

Functionalized Polymers

The inventors have found that functionalized polymers are important in order to maintain the heat resistance of the hot melt composition.

The hot melt composition of this invention includes at least two functionalized polymers. The two functionalized polymers are chosen to have functional groups that react with each other. The inventors theorize that the reacted polymers form a network throughout the composition that results in increased heat resistance. The inventors have unexpectedly discovered that this network is still formed even when limited amounts of the functionalized polymers are used. The functionalized polymers can be copolymers of ethylene and various functional groups.

In a preferred embodiment, the hot melt composition is substantially free of curing agents. Curing agents include any species other than the first functionalized polymer and the second functionalized polymer that facilitates or is involved in the curing reaction of the functionalized polymers. Curing agents include materials such as e.g. peroxides, amines, phenols, etc.

The first functionalized polymer includes a functional group selected from the group consisting of carboxylic anhydrides, carboxylic acids, epoxy groups and combinations thereof.

The first functionalized polymer can include ethylene and a carboxylic acid anhydride functional group. The carboxylic acid anhydride functional group can be chosen, from maleic, itaconic, citraconic, allylsuccinic, cyclohex-4-ene-1,2-dicarboxylic, 4-methylenecyclohex-4-ene-1,2-dicarboxylic, bicyclo[2.2.1]hept-5-ene-2,3-dicarboxylic and x-methylbicyclo[2.2.1]hept-5-ene-2,2-dicarboxylic anhydrides.

The first functionalized polymer can include ethylene and a carboxylic acid. The carboxylic acid can be chosen from the group consisting of acrylic acid and methacrylic acid.

The first functionalized polymer can include ethylene and an epoxy group. Examples of epoxy-containing monomer units include aliphatic esters and glycidyl ethers such as an allyl glycidyl ether, a vinyl glycidyl ether, a maleate or itaconate of glycidyl, a glycidyl methacrylate, and alicyclic esters and glycidyl ethers, such as a 2-cyclohexene-1-glycidyl ether, a cyclohexene-4, 5-diglycidyl carboxylate, a cyclohexene-4 glycidyl carboxylate, a 5-norbornene-2-methyl-2-glycidyl carboxylate and an endo cis-bicyclo (2,2,1)-5-heptene-2,3-diglycidyl dicarboxylate.

The epoxy-containing monomer unit is preferably incorporated as a comonomer, i.e. by copolymerizing an olefin monomer with the vinyl group containing comonomer bearing an epoxy group (=epoxy-group containing monomer unit). Most preferably, the epoxy-group-containing monomer units are glycidyl methacrylate comonomer units.

The second functionalized polymer includes a functional group capable of reacting with the functional group of the first functionalized polymer.

The first functionalized polymer and/or the second functionalized polymer can be functionalized alkyl(meth)acrylates. Preference is given to alkyl(meth)acrylates having an alkyl chain comprising from 1 to 4 carbon atoms, preferably methyl, ethyl or butyl.

Alternatively, the first functionalized polymer and/or the second functionalized polymer can be functionalized ethylene alpha olefin copolymers such as e.g. single site catalyzed ethylene alpha olefin copolymers functionalized with maleic anhydride, glycidyl methacrylate, etc.).

The first functionalized polymer can be a copolymer of ethylene and an epoxy group and the second functionalized polymer can a copolymer of ethylene and at least one monomer selected from the group consisting of a carboxylic anhydride, a carboxylic acid, and combinations thereof.

The first functionalized polymer can be a random copolymer of ethylene and of maleic anhydride or a random copolymer of ethylene, of alkyl methacrylate and of maleic anhydride and the second functionalized polymer can be a random copolymer of ethylene and of glycidyl methacrylate or a random terpolymer of ethylene, of alkyl methacrylate and of glycidyl methacrylate.

The functionalized polymers can be formed by radical polymerization processes at high pressure in an autoclave reactor or in a tubular reactor, which are techniques known to a person skilled in the art.

The functionalized polymers can have a melt flow index as tested by ASTM D 1238 (190° C., 2.16 kg) of from 2 g/10 min to 500 g/10 min, from 2 g/10 min to 100 g/10 min, or even from 2 g/10 min to 50 g/10 min.

Useful functionalized polymers include those available under the LOTADER trade designation including LOTADER 4210, an ethylene butyl acrylate maleic anhydride terpolymer, having 6.5% by weight butyl acrylate, 3.6% by weight maleic anhydride and a melt flow index of 10 g/10 min as tested by ASTM D 1238 (190° C., 2.16 kg) and LOTADER AX 8840, an ethylene glycidyl methacrylate copolymer, having 6-8% by weight glycidyl methacrylate and a melt flow index of 5 g/10 min as tested by ASTM D 1238 (190° C., 2.16 kg), both available from SK Functional Polymer (Courbevoie, France), NUCREL 0910, an ethylene methacrylic acid copolymer, having 8.7% by weight methacrylic acid and a melt flow index of 10 g/10 min as tested by ASTM D 1238 (190° C., 2.16 kg), ELVALOY 4170, an ethylene terpolymer having a melt flow index of 8 g/10 min as tested by ASTM D 1238 (190° C., 2.16 kg), and FUSABOND M603, a maleic anhydride functionalized ethylene copolymer having a melt flow index of 25 g/10 min as tested by ASTM D 1238 (190° C., 2.16 kg) all available from Dow Chemical (Houston, Texas).

The hot melt composition includes from 2% by weight to 15% by weight, from 3% by weight to 15% by weight, from 2% by weight to 10% by weight, from 3% by weight to 10% by weight, or even from 3% by weight to 7.5% by weight of the first functionalized polymer and from 2% by weight to 15% by weight, from 3% by weight to 15% by weight, from 2% by weight to 10% by weight, from 3% by weight to 10%, or even from 3% by weight to 7.5% by weight of the second functionalized polymer.

Silane Adhesion Promoter

The hot melt adhesive composition can include a silane adhesion promoter. The silane adhesion promoter helps improve adhesion between the encapsulant and the glass. The silane adhesion promoter is not limited and can include any type of silane composition useful in promoting the adhesion of the hot melt composition to a substrate.

The silane adhesion promoter can be selected from the group consisting of a silane, an amino silane, an epoxy silane, an isocyanurate silane and any other silane.

The hot melt composition can include from 0.05% by weight to 5% by weight, from 0.1% to 3% by weight, or even from 0.2% by weight to 2% by weight of the silane adhesion promoter.

Useful silane adhesion promoters include those available under the DYNASYLAN trade designation, include DYNASYLAN GLYMO, a bifunctional organosilane possessing a reactive organic epoxide and hydrolyzable inorganic methoxysilyl groups, DYNASYLAN AMMO, 3-(trimethoxysilyl)propylamine and DYNASYLAN VPS7161, isocyanurate silane with a high concentration of trimethoxysilyl groups all available from Evonik GmBH (Hanau, Germany) and COATOSIL MP200, an epoxy functional silane oligomer available from Momentive Performance Materials Inc.

Fillers

The hot melt composition can include a filler. The filler can be selected from the group consisting of silica, treated silica, alumina, calcium carbonate, barium sulfate, zinc oxide, clay, talc, carbon nanotubes and carbon black. The hot melt composition can alternatively include any other filler.

The composition can include up to 50% by weight, from 5% by weight to 50%, from 5% by weight to 30% by weight, or even from 5% by weight to 20% by weight of a filler.

Optional Components

The hot melt composition can include optional components such as e.g. UV stabilizers (e.g. benzophenone, benzotriazole, etc.), antioxidants, hindered amine light stabilizers (HALS), flame retardants, tackifying resins, other polymers (e.g. LDPE, other olefin polymers, acrylics (JONCRYL ADR, etc.), other pigments, dyes and optical brighteners.

Useful commercially available UV stabilizers include CYABSORB UV531 and CYAB SORB UV 9, available from Solvay S.A. (Brussels, Belgium).

Method of Making

The hot melt composition can be made by blending the required materials with the optional additives using known techniques for blending thermoplastics, such as, for example, extrusion or kneading. Useful methods of extrusion or kneading include internal blade or rotor mixers, an external mixer, or single-screw or corotating or counterrotating twin-screw extruder.

Hot Melt Composition in the Form of a Film

The hot melt composition is preferably used in the form of a film. The film can have a thickness ranging from 0.1 mm to 20 mm, from 0.2 mm to 20 mm, or even from 0.5 mm to 10 mm.

The functionalized polymers will begin to react as they are made into a film and will continue to react in the process by which the module is made.

The film can be a monolayer (i.e. one layer consisting of the hot melt composition) or a multilayer. When it is multilayer, the hot melt composition can be present as two or more films or can be combined with layers of other materials conventionally used in the photovoltaic field e.g. polyolefins, ionomers, fluoropolymers, etc.

The film can be obtained by a method selected from the group consisting of pressing, tubular (bubble) extrusion-blow molding, extrusion-laminating, extrusion-coating, flat sheet extrusion (also known as extrusion-casting) and calendaring. When extruded, a gravimetric feeder can be used to feed the various materials into the extruder.

Thin Film PV Module

The hot melt composition in the form of a film can serve as an encapsulant in a thin film PV module.

The thin film PV module can include a front sheet on which the photovoltaic cells can be deposited, the hot melt composition in the form of a film as an encapsulant, and a back sheet. The hot melt composition in the form of a film is located between the front sheet and the back sheet and adheres the assembly together.

The front sheet needs to be transparent. The front sheet can be comprised of glass or a transparent plastic (e.g. poly methyl methacrylate, polytetrafluoroethylene (ptfe), poly (ethene-co-tetrafluoroethene) (etfe), polyester, or any other transparent plastic).

The photovoltaic cells can be deposited on the front sheet, back sheet, or a separate substrate such as e.g. metal film. The photovoltaic cell can comprise a number of materials e.g. CIGS (copper indium gallium diselenide), CdTe (cadmium telluride), amorphous thin-film silicon (a-Si, TF-Si), copper indium disilenide (CIS), organics and perovskite.

In some thin film PV modules, when the photovoltaic cells are deposited on the front sheet, the encapsulant does not need to be transparent.

The back sheet can comprise glass, plastic or metal. The back sheet can be flexible or not flexible.

In one embodiment, the front sheet and the back sheet are glass, the photovoltaic cells comprise CdTe and are deposited on the front sheet and the hot melt composition in the form of a film bonds the assembly together.

The thin film PV module can further include an edge seal. The edge seal is a material that forms a seal between the outer edges of the front sheet and back sheet to provide an extra barrier to prevent moisture from weakening the structure of the module or damaging the cells. The edge seal is commonly based on butyl rubber but could alternately be based on polyisobutylene. The edge seal can further include a desiccant material.

The various layers can be assembled by any type of pressing technique, such as, for example, hot pressing, vacuum pressing or laminating (e.g. heat laminating). The thin film PV module can be laminated at temperatures of from 120° C. to 180° C., or even at temperature of from 140° C. to 170° C.

The invention will now be described by way of the following examples. All parts, ratios, percents and amounts stated in the Examples are by weight unless otherwise specified.

EXAMPLES

Test Procedures

Test procedures used in the examples and throughout the specification, unless stated otherwise, include the following. The amounts of raw materials listed in Table 1 are in weight percent.

Approximate Melt Index

For the samples in Table One an approximate Melt Index was arrived upon based on the melt index ASTM D 1238 (190° C., 2.16 kg) of the various components as reported by their suppliers, using a calculated weighted average. For example, MI of Ex 1=MI of EBAC SB2811*(72.37/100)+ MI of LOTADER AX 8840*(4.5/100)+MI of LOTADER 4210*(4.5/100)+MI of ENGAGE 8411*(18/100)

Storage Modulus

The Storage Modulus was obtained by a dynamic mechanical analysis (DMA) temperature sweep using a TA (Thermal Analysis) Instruments Inc. dynamic mechanical analyzer. The following method was used. The sample was equilibrated at −100° C. for 0.15 minutes and then heated at 3° C./minute at 1 Hz with a static load of 0.1 Newtons to 100° C.

TABLE 1

|  | Comp 1 | Comp 2 | Comp 3 | Ex. 1 | Ex. 2 | Ex. 3 | Ex. 4 | Ex. 5 |
|---|---|---|---|---|---|---|---|---|
| EBAC SB2811 | 79.67 | 78.67 | 74.8 | 72.37 | 63.37 | 54.37 | 45.37 | 62.9 |
| LOTADER AX 8840 | 3.9 | 3.6 | 5.4 | 4.5 | 4.5 | 4.5 | 4.5 | |
| LOTADER 4210 | 3.9 | 3.6 | 5.4 | 4.5 | 4.5 | 4.5 | 4.5 | |
| FUSABOND M603 | | | | | | | | 6.74 |
| ELVALOY 4170 | | | | | | | | 2.7 |
| ENGAGE 8411 | 11.9 | 13.5 | 13.5 | 18 | 27 | 36 | 45 | 26.94 |
| DYNASYLAN GLYMO | .45 | .45 | .45 | .45 | .45 | .45 | .45 | 0.45 |
| CYABSORB UV531 | .18 | .18 | .45 | .18 | .18 | .18 | .18 | |
| CYABSORB UV 9 | | | | | | | | 0.27 |
| Approximate Melt Index (g/10 min) | 18.7 | 18.7 | 18.2 | 18.4 | 18.2 | 18.0 | 17.8 | 19.3 |
| Storage Modulus (MPa) | | | | | | | | |
| @−50° C. | 1861 | 1691 | 1727 | 1394 | 1286 | | | |
| @−40° C. | 1342 | 1128 | 1139 | 818.6 | 717.1 | | | |
| @−30° C. | 651.2 | 515.5 | 579.1 | 364.4 | 327.3 | | | |
| @−20° C. | 346 | 283.3 | 309.4 | 176.1 | 178.6 | | | |
| @−10° C. | 205.4 | 182.5 | 218.6 | 101.2 | 121.1 | | | |
| @ 0° C. | 146.8 | 126.2 | 161.5 | 71.35 | 91.85 | | | |

FIG. 1 shows a graphical representation of the storage modulus data. In FIG. 1, it is clear that Ex 1 and Ex 2 have a relatively lower storage modulus when compared to Comp 1, 2 and 3 at a temperature range of between 0° C. and −50° C.

The inventors have found that the relatively lower storage modulus of Ex 1 and Ex 2 (as compared to Comp 1, 2 and 3) enabled Ex 1 and Ex 2 to have improved performance in Humidity/Freeze cycling when used as an encapsulant in a thin film PV module.

In Humidity/Freeze cycling, the panel spends 20 hours at 85° C.+85% Relative Humidity, then is cooled to −40° C. for 4 hours. Each 24-hour period is 1 cycle. As a typical industry standard, the panel needs to remain defect free for at least 10, or even at least 20 cycles.

Other embodiments are within the claims.

What is claimed is:

1. A hot melt composition in the form of a film comprising:
    a. from 40% by weight to 80% by weight of a non-functionalized alkyl acrylate,
    b. from 14% by weight to 50% by weight of an olefin polymer comprising a copolymer of ethylene and propylene,
    c. from 2% by weight to 15% by weight of a first functionalized polymer comprising a functional group selected from the group consisting of epoxides, carboxylic anhydrides and carboxylic acids, and
    d. from 2% by weight to 15% by weight of a second functionalized polymer comprising a functional group capable of reacting with the functional group of the first functionalized polymer.

2. The hot melt composition of claim 1 wherein the olefin polymer has a Melt Index of from 5 g/10 min to 100 g/10 min as tested according to ASTM D1238 (190° C., 2.16 kg).

3. The hot melt composition of claim 1 wherein the olefin polymer has a Melt Index of from 5 g/10 min to 40 g/10 min as tested according to ASTM D1238 (190° C., 2.16 kg).

4. The hot melt composition of claim 1 wherein in the olefin polymer has a density of from 0.85 g/cm3 to 0.90 g/cm3.

5. The hot melt composition of claim 1 wherein the olefin polymer is polymerized by single-site catalysis.

6. The hot melt composition of claim 1 wherein the olefin polymer is polymerized by Ziegler-Natta catalysis.

7. The hot melt composition of claim 1 wherein the olefin polymer further comprises an olefin polymer selected from the group consisting of a copolymer of ethylene and octene, a copolymer of ethylene and butene and a copolymer of ethylene and hexene.

8. The hot melt composition of claim 1 having an approximate Melt Index of from 5 g/10 min to 80 g/10 min.

9. The hot melt composition of claim 1 wherein the non-functionalized alkyl acrylate is selected from the group consisting of ethylene n-butyl acrylate and ethylene methyl acrylate.

10. The hot melt composition of claim 1 wherein the non-functionalized alkyl acrylate is an ethylene n-butyl acrylate having a n-butyl acrylate content of from 3% by weight to 35% by weight and a Melt Index of from 5 g/10 min to 50 g/10 min when tested by ASTM D 1238 (190° C., 2.16 kg).

11. The hot melt composition of claim 1 wherein the first functionalized copolymer and the second functionalized copolymer are ethylene copolymers.

12. The hot melt composition of claim 1 wherein:
the first functionalized polymer is selected from the group consisting of a random copolymer of ethylene and maleic anhydride, a random copolymer of ethylene, alkyl(meth)acrylate and maleic anhydride and,
the second functionalized polymer is selected from a group consisting of a random copolymer of ethylene and glycidyl methacrylate and a random terpolymer of ethylene, alkyl(meth)acrylate and glycidyl methacrylate.

13. The hot melt composition of claim 1 being free of ethylene vinyl acetate, peroxide, and poly vinyl chloride.

14. The hot melt composition of claim 1 comprising:
from 55% by weight to 75% by weight of the non-functionalized alkyl acrylate,
from 15% by weight to 25% by weight of the olefin polymer,
from 3% by weight to 10% by weight of the first functionalized polymer, and
from 3% by weight to 10% by weight of the second functionalized polymer.

15. The hot melt composition of claim 1, further including a silane adhesion promoter selected from the group consisting of amino silane, epoxy silane, and isocyanurate silane.

16. The hot melt composition of claim 1 further comprising from 5% by weight to 50% by weight of a filler.

17. A photovoltaic module comprising the hot melt composition in the form of a film of claim 1.

18. The thin film photovoltaic module comprising:
a. a front sheet,
b. a layer of photovoltaic cells in contact with the front sheet,
c. the hot melt composition in the form of a film of claim 1, and
d. a back sheet,
wherein the hot melt composition in the form of a film is located between the photovoltaic cells and the back sheet and adheres the front sheet to the back sheet.

19. The thin film photovoltaic module of claim 18 wherein the photovoltaic cells are selected from the group consisting of CIGS (copper indium gallium diselenide), CdTe (cadmium telluride), amorphous thin-film silicon (a-Si, TF-Si) and copper indium disilenide (CIS) and perovskite based systems.

20. The thin film photovoltaic module of claim 18 further comprising an edge seal.

* * * * *